US011869327B2

(12) United States Patent
Staeger et al.

(10) Patent No.: US 11,869,327 B2
(45) Date of Patent: Jan. 9, 2024

(54) FIRE OR SMOKE ALARM

(71) Applicant: Siemens Schweiz AG, Zürich (CH)

(72) Inventors: Mathias Staeger, Menzingen (CH); Walter Vollenweider, Kriegstetten (CH)

(73) Assignee: SIEMENS SCHWEIZ AG, Zurich (CH)

( * ) Notice: Subject to any disclaimer, the term of this patent is extended or adjusted under 35 U.S.C. 154(b) by 436 days.

(21) Appl. No.: 17/415,399

(22) PCT Filed: Nov. 25, 2019

(86) PCT No.: PCT/EP2019/082414
§ 371 (c)(1),
(2) Date: Jun. 17, 2021

(87) PCT Pub. No.: WO2020/126326
PCT Pub. Date: Jun. 25, 2020

(65) Prior Publication Data
US 2022/0068102 A1 Mar. 3, 2022

(30) Foreign Application Priority Data
Dec. 18, 2018 (EP) .................................... 18213375

(51) Int. Cl.
G08B 17/113 (2006.01)
H05K 1/18 (2006.01)
(52) U.S. Cl.
CPC ............. G08B 17/113 (2013.01); H05K 1/18 (2013.01); H05K 2201/10151 (2013.01)

(58) Field of Classification Search
CPC ................... G08B 17/113; H05K 1/18; H05K 2201/10151
See application file for complete search history.

(56) References Cited

U.S. PATENT DOCUMENTS 5,772,326 A    6/1998   Batko et al. .................. 374/142
8,610,586 B2  12/2013   Shimada et al. .............. 340/627

FOREIGN PATENT DOCUMENTS

| CN | 101978400 A | 2/2011 | ............. G08B 17/00 |
| CN | 103646490 A | 3/2014 | ............. G08B 17/00 |
| EP | 0227320 A2  | 7/1987 | ........... G08B 17/107 |
| EP | 0 257 325   | 3/1988 | ............. G08B 17/10 |
| GB | 2 306 218   | 4/1997 | ............. G08B 17/00 |

(Continued)

OTHER PUBLICATIONS

Search Report for International Application No. PCT/EP2019/082414, 11 pages.

Primary Examiner — Dhaval V Patel
(74) Attorney, Agent, or Firm — Slayden Grubert Beard PLLC

(57) ABSTRACT

Various embodiments include a fire or smoke alarm comprising: a detection arrangement arranged within an alarm housing; and an alarm-housing cover having, on an inner side, a plurality of housing ribs pointing radially in the direction of an alarm dome. The detection arrangement comprises a level divider with an opening. A maximum possible spacing between two points on a peripheral line of the opening or on a common peripheral line of a plurality of openings is larger than a diameter of the alarm dome. The peripheral line of the opening or the common peripheral line of a plurality of openings in the level divider extends beyond the alarm dome of the alarm-housing cover on all sides.

15 Claims, 9 Drawing Sheets

(56) References Cited

FOREIGN PATENT DOCUMENTS

| | | | | |
|---|---|---|---|---|
| JP | H09185787 A | 7/1997 | ............. | G08B 21/00 |
| JP | 2009223360 A | 10/2009 | ............. | G08B 17/06 |
| JP | 2011164691 A | 8/2011 | ............. | G08B 17/00 |

FIRE OR SMOKE ALARM

CROSS-REFERENCE TO RELATED APPLICATIONS

This application is a U.S. National Stage Application of International Application No. PCT/EP2019/082414 filed Nov. 25, 2019, which designates the United States of America, and claims priority to EP Application No. 18213375.1 filed Dec. 18, 2018, the contents of which are hereby incorporated by reference in their entirety.

TECHNICAL FIELD

The present disclosure relates to sensors and alarms. Various embodiments include devices that acts as an alarm for fire or smoke.

BACKGROUND

Fire or smoke alarms typically comprise, in a housing, a smoke detection device—that is to say sensor equipment for detecting for example smoke gases or similar. Possible ways of optimizing such fire alarms relate for example to their structural layout, a smaller number of parts, and/or a favorable flow route in the interior of the fire alarm.

GB 2 306 218 A describes a combined alarm and signal-emitting device for a fire alarm system. The device comprises a base in which a printed circuit board and a signal-emitting device are accommodated, and a removable dome-shaped head in which an optical smoke sensing chamber is accommodated. A temperature sensor mounted on the printed circuit board extends into an air duct between the detection chamber and the housing. Electrical smoke detecting components such as an LED and a phototransistor extend from the printed circuit board through the air duct and into the smoke sensing chamber. The fact that all the electrical components are arranged on the base means that the measurement chamber can be opened for the purpose of cleaning the optical components without the need to disconnect electrical connections between the removable head and the base.

SUMMARY

Various embodiments of the teachings of the present disclosure include fire or smoke alarms (10) having a detection arrangement (16) arranged in the interior of an alarm housing (12), wherein the alarm housing (12) comprises at least one alarm-housing cover (14), characterized
in that, on an inner side, the alarm-housing cover (14) has a plurality of housing ribs (32) that point radially in the direction of an alarm dome (34),
in that the detection arrangement (16) comprises at least one level divider (18) and the level divider (18) has at least one opening (60),
in that a maximum possible spacing between two points on a peripheral line of the opening (60) or on a common peripheral line of a plurality of openings (60) is larger than a diameter of the alarm dome (34), and
in that the peripheral line of the opening (60) in the level divider (18) or the common peripheral line of a plurality of openings (60) in the level divider (18) extends beyond the alarm dome (34) of the alarm-housing cover (14) on all sides.

In some embodiments, a printed circuit board (18) acts as a level divider (18).

In some embodiments, a combination of a printed circuit board (18) and an additional flat component acts as a level divider (18), and the printed circuit board (18) and the flat component are arranged parallel to one another and on the same level, or the printed circuit board (18) and the flat component are arranged parallel to one another and on parallel levels.

In some embodiments, the level divider (18) is arranged in the alarm housing (12) with the peripheral line of its opening (60) or the common peripheral line of a plurality of openings (60) concentric with the alarm dome (34) of the alarm-housing cover (14).

In some embodiments, there is a level divider (18) having a circular outer circumferential line.

In some embodiments, the peripheral line of the opening (60) or the common peripheral line of a plurality of openings (60) is concentric with the circular outer circumferential line.

In some embodiments, in addition to the alarm-housing cover (14), the alarm housing (12) comprises a chamber part (36), the alarm-housing cover (14) and the chamber part (36) can be combined with one another, the chamber part (36) comprises wall portions (40) that together form a measurement chamber (38) having a side that is open to the alarm-housing cover (14), and the side of the measurement chamber (38) that is open to the alarm-housing cover (14) is on a level with the level divider (18).

In some embodiments, the chamber part (36) closes the measurement chamber (38) off on the side remote from the or each opening (60).

In some embodiments, the interior of the measurement chamber (38) is fluidically coupled to the area surrounding the fire or smoke alarm (10), by means of the or each opening (60) in the level divider (18).

In some embodiments, there is a plurality of openings (60) that are in the shape of a circle segment or circle sector and have a common peripheral line and in each case a web (62) between two adjacent openings (60), and an item of sensor equipment (70) on at least one web (62) or each web (62).

In some embodiments, there is a plurality of openings (60) that are in the shape of a circle segment or circle sector and have a common peripheral line and in each case a web (62) between two adjacent openings (60), wherein the webs (62) carry a center piece (64), and wherein the center piece (64) carries an item of sensor equipment (70) and/or a display element.

In some embodiments, the item of sensor equipment (70) comprises at least one temperature-sensitive sensor (70).

In some embodiments, there is an insect protection element (72) that covers the or each opening (60).

In some embodiments, there is at least one insect protection element (72) that is arranged along an enclosed circular line, having a diameter larger than the maximum possible spacing between two points on a peripheral line of the opening (60) or on a common peripheral line of a plurality of openings (60), wherein the insect protection element (72) is adjacent to the inner side of the alarm-housing cover (14) and, from the inner side of the alarm-housing cover (14), has a height corresponding to a height of the housing ribs (32) on the inner side of the alarm-housing cover (14).

In some embodiments, there is an insect protection element (72) that lies on a level on the free upper edges of the housing ribs (32).

BRIEF DESCRIPTION OF THE DRAWINGS

An exemplary embodiment of the teachings herein is explained in more detail below with reference to the drawings. Mutually corresponding items or elements are provided with the same reference numerals in all the figures. In the drawings.

DETAILED DESCRIPTION

Figure 1:
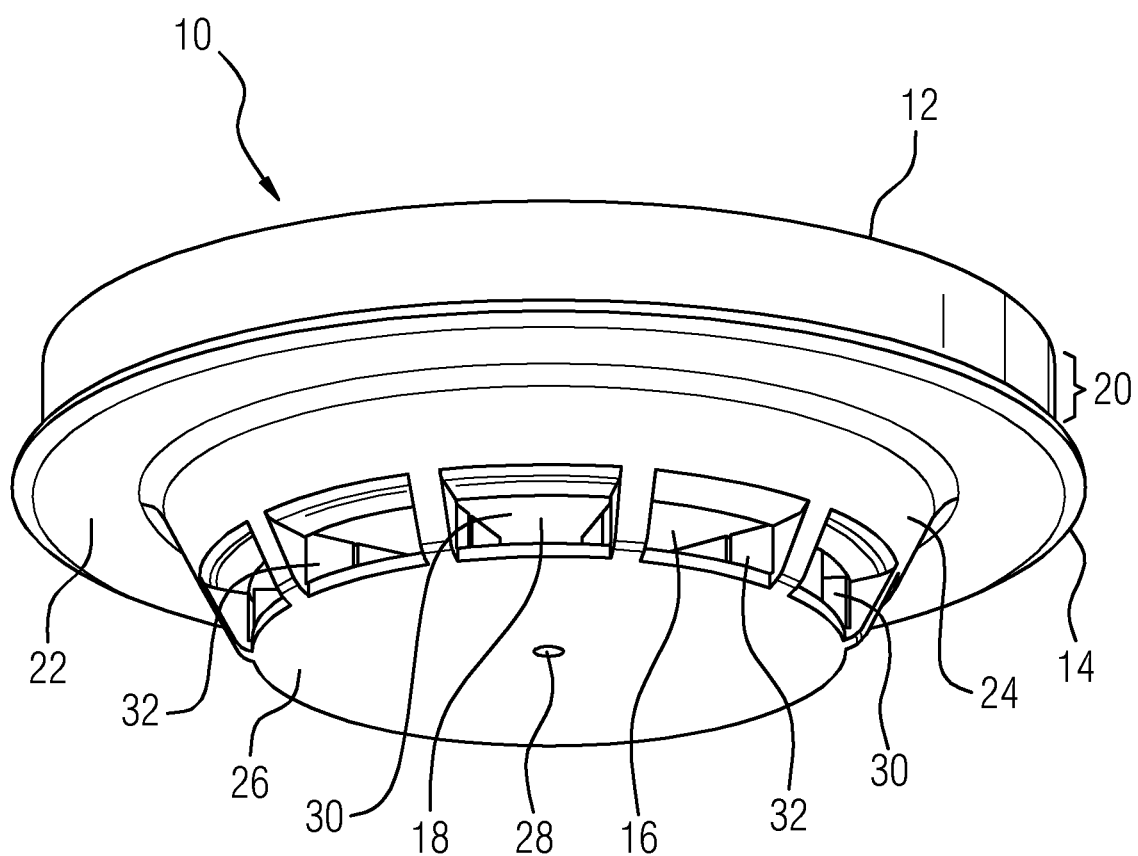
FIG. 1 shows a fire or smoke alarm incorporating teachings of the present disclosure.

The present disclosure describes fire and/or smoke alarms having a detection arrangement arranged in the interior of an alarm housing, in particular a smoke detection arrangement and/or a gas detection arrangement, wherein the alarm housing comprises at least one housing part that acts as the alarm-housing cover. On an inner side, the alarm-housing cover has a plurality of housing ribs that point radially in the direction of a dome-like portion of the alarm-housing cover, designated the alarm dome below. The housing ribs are effective for guiding air in the interior of the alarm housing and bring about forced through-flow through a measurement chamber in the interior of the fire alarm. Access to the measurement chamber is by way of the at least one opening, namely for example at least one opening in a printed circuit board that forms part of the detection arrangement.

In some embodiments, the center point of the alarm dome lies on the main structural axis of the fire or smoke alarm (central alarm dome). This main axis extends, as the vertical axis, from the "floor" to the "ceiling" of the alarm housing and through the center point of a circular alarm housing of the fire or smoke alarm. However, a position of the alarm dome of this kind is explicitly only one option. The center point of the alarm dome may also be at a spacing from the main axis. In that case, the result is a fire or smoke alarm having an eccentric alarm dome.

In some embodiments, where there is a printed circuit board having at least one opening, it acts as a dividing or separating element within the fire or smoke alarm. The printed circuit board divides different levels within the fire or smoke alarm from one another. Instead of a printed circuit board, this dividing or separating action may also be achieved by means of a printed circuit board and an additional flat component that, together with the printed circuit board, is arranged on the same level. In some embodiments, this dividing or separating action may also be achieved by means of a printed circuit board together with an additional flat component that is arranged on a level parallel to the level with the printed circuit board, in particular on a level directly adjacent to the level with the printed circuit board. As the flat component, in each case a plastic part that is in particular planar is possible. A printed circuit board together with at least one such flat component is thus suitable for acting as a level divider within the fire or smoke alarm. The designation "level divider" is thus used here as an umbrella term, either for a printed circuit board that acts alone as a dividing or separating element within the fire or smoke alarm, or for a combination of a printed circuit board and at least one flat component of the above-mentioned type, wherein the combination acts as a dividing or separating element within the fire or smoke alarm.

Nevertheless, for the sake of making the description below easier to read, it will refer below to a printed circuit board that acts alone as a level divider. Every time a printed circuit board is mentioned, it should always be understood that a level divider that comprises the printed circuit board and at least one flat component of the above-mentioned type instead of the individual printed circuit board is also included.

In the case of a printed circuit board (level divider) having exactly one opening, a diameter of the opening (the maximum possible spacing between two points on a peripheral line of the opening) is therefore larger than a diameter of the alarm dome, and the peripheral line of the opening in the printed circuit board extends beyond the alarm dome (a central alarm dome or an alarm dome) on all sides. In a particular embodiment, the printed circuit board is arranged such that the peripheral line of its opening is concentric with the alarm dome.

In some embodiments, instead of one opening, a printed circuit board may have a plurality of openings. For example, the printed circuit board may have a plurality of openings if an opening is subdivided into a plurality of regions/openings by webs.

The way the position of the plurality of openings in relation to the alarm dome is defined relates to a common peripheral line of the openings, in particular a common peripheral line of the openings in the shape of a circular line (the parts of the peripheral line that belong with a respective opening are arcs, and all the arcs that form part of the peripheral line have the same radius). In the case of a plurality of openings—unlike the case of a single opening—it is not possible to speak of a diameter. So the maximum possible spacing of two points on the above-mentioned common peripheral line is considered. This is larger than a diameter of the alarm dome, and the printed circuit board is arranged with the common peripheral line of a plurality of openings such that this peripheral line extends beyond the alarm dome of the alarm-housing cover on all sides. In a particular embodiment, this is achieved in that the printed circuit board is arranged with the common peripheral line of the openings concentric with the alarm dome.

In both situations (one opening or a plurality of openings), the openings leave space, adjacent to the alarm dome, for an air flow from a level below the printed circuit board, namely the level having the housing ribs acting as guide elements, onto a level above the printed circuit board and the measurement chamber there. The relative terms "below" and "above" relate to the printed circuit board and to a fire alarm mounted on the ceiling of a room. The size of the opening and its position, or the size of all the openings and their position, enable the outlined air flow into the measurement chamber.

The printed circuit board (level divider) having the at least one opening covers over the housing ribs, such that the printed circuit board takes the place of an additional, otherwise required housing part and defines two levels in the alarm housing.

The various embodiments described herein should not be understood as ruling out achievement of independent, objective protection for the features or combinations of features.

In some embodiments, there is a printed circuit board (level divider) having a circular outer circumferential line, wherein the peripheral line of the opening or the common peripheral line of a plurality of openings is concentric with the outer circumferential line. In that case, the opening—or the totality of the openings—is located in the center of the printed circuit board. A circular printed circuit board of this kind is particularly easy to put in position, in particular in or on a housing part that is circular in its basic shape, for example a circular alarm-housing cover. With the or each opening in the center of the printed circuit board, when the printed circuit board is put in position in the respective housing part the position of the or each opening in relation to a central housing part, in particular the alarm dome of the alarm-housing cover, is ensured.

In some embodiments, there is a printed circuit board having a plurality of openings that are in the shape of a circle segment or circle sector or are substantially in the shape of a circle segment or circle sector and have a common peripheral line. This plurality of openings is produced in that an opening is divided into individual regions by a web or a plurality of webs. Each region is a separate opening in the printed circuit board. Each web between two adjacent openings of this kind is a possible location for an item of sensor equipment, for example an item of sensor equipment in the form of at least one temperature-sensitive sensor. In some embodiments, at least one web of this kind carries at least one sensor, in particular a sensor acting as a temperature sensor. Placing an item of sensor equipment on at least one web means that the item of sensor equipment is positioned directly above the region in which air from the level below the printed circuit board flows onto the level above the printed circuit board and the measurement chamber there.

In some embodiments, each web that delimits respectively two adjacent openings from one another carries in each case at least one temperature-sensitive sensor. In that case, a spatial temperature distribution can be determined in the region of the transition from the level below the printed circuit board to the level above the printed circuit board and the measurement chamber there. In the event of fire, the spatial temperature distribution is an indication of a position of the seat of the fire, taking as a starting point the position of the fire or smoke alarm.

In some embodiments, an item of sensor equipment, in particular a temperature-sensitive item of sensor equipment, is located in the region of the transition from the level below the printed circuit board to the level above the printed circuit board and the measurement chamber there consists, in the case of a fire or smoke alarm having a plurality of openings that are in the shape of a circle segment or circle sector and have a common peripheral line and in each case a web between two adjacent openings, in these webs carrying a center piece. In some embodiments, the webs carry a center piece that is concentric with the common peripheral line of the openings, and the center point of the center piece coincides with the center point of the common peripheral line of the openings. Then, the center piece and an item of sensor equipment there—for example an item of sensor equipment in the form of a temperature sensor or an item of sensor equipment comprising at least one temperature sensor—are located in the center of the region of the transition between said two levels.

In some embodiments, the alarm-housing cover and the chamber part can be combined with one another, in particular detachably combined with one another. In some embodiments, the alarm-housing cover and the chamber part are the only housing parts of the fire or smoke alarm. The chamber part has wall portions that together form a measurement chamber having a side that is open to the alarm-housing cover. Consequently, there is no need for a separate housing part for delimiting the measurement chamber. The side of the measurement chamber that is open to the alarm-housing cover is preferably on a level with the printed circuit board. In that case, the printed circuit board covers over the measurement chamber and/or further recesses that are formed by wall portions extending from the chamber part and that are for example for LEDs and/or at least one photodiode.

The interior of the measurement chamber is fluidically coupled to the area surrounding the fire or smoke alarm, by means of the openings in the printed circuit board. Combustion gases or smoke gases can enter the measurement chamber (alarm chamber) and can flow through the measurement chamber. Because the chamber part closes the measurement chamber off on the side remote from the alarm-housing cover, there is no need for a separate housing part for such closing off—that is to say a housing part or similar that acts as a lid to the measurement chamber.

In some embodiments, the openings in the printed circuit board are covered directly or indirectly by means of an insect protection element, in particular by means of an insect protection element in the form of an insect grille, such that insects or similar cannot penetrate as far as the measurement chamber and for example trigger a false alarm.

In some embodiments, there is at least one insect protection element, e.g., an insect grille, arranged along an enclosed line, e.g. a circular line having a diameter larger than the maximum possible spacing between two points on a peripheral line of the opening in the printed circuit board, or on a common peripheral line of a plurality of openings in the printed circuit board. The result is that the insect protection element is located below the printed circuit board and outside the region of the openings.

In relation to an air flow into the measurement chamber, the insect protection element is located upstream of the openings, and in this position is capable of effectively preventing insects or similar from being able to penetrate into the measurement chamber by way of the or each opening and for example trigger a false alarm. On the level below the printed circuit board, which has the housing ribs, the insect protection element is adjacent on the one hand to the inner side of the alarm-housing cover and on the other to the printed circuit board.

In some embodiments, the height of the insect protection element, from the inner side of the alarm-housing cover, corresponds to a height of the ribs on the inner side of the alarm-housing cover, with the result that the insect protection element covers the vertical clearance of the level below the printed circuit board. In this case, the insect protection element that is arranged on this level along an enclosed line, in particular a circular line, intersects—in particular vertically—each housing rib, which is integrally formed for example on the inner side of the alarm-housing cover. Such a housing rib that is integrally formed on the inner side of the alarm-housing cover is interrupted for example in the region in which the insect protection element intersects the housing rib, such that the interruption permits the insect protection element to be guided through.

The fire or smoke alarms described herein can be produced such that it takes up little space and has a minimal number of housing parts—in particular housing parts made of plastic material.

Because the chamber part, from which the wall portions extend defining the measurement chamber that is open on one side, closes off the measurement chamber as well in the manner of a lid, the fire or smoke alarm is prevented from any stack effect that is to say that an air flow cannot penetrate from the alarm plinth into the measurement chamber.

The exemplary embodiment should not be taken as a restriction of the scope of the disclosure. Rather, additions and modifications are also possible, in particular those which a person skilled in the art can infer about the solution of the object, for example by combining or altering individual features or method steps that are described in connection with the general or particular part of the description and included in the claims and/or the drawing, and which result in new subject matter as a result of combinable features.

The illustration in FIG. 1 shows an embodiment of an alarm designated a fire alarm 10 for short below, without, however, ruling out a more general applicability. In the illustration in FIG. 1, the fire alarm 10 is shown in an orientation and perspective as produced if the fire alarm 10 is mounted on a ceiling of a room in a building. Of the fire alarm 10, there is visible in the illustration in FIG. 1 a part of a housing (alarm housing 12), namely a housing part that is designated the alarm-housing cover 14 below, or the cover 14 for short. Located in the interior of the alarm housing 12 is a detection arrangement 16. The detection arrangement 16 comprises a printed circuit board 18. In the illustration in FIG. 1, of the detection arrangement 16 only part of the printed circuit board 18 is visible.

In the embodiment shown, and in a fundamentally optional manner, the basic shape of the cover 14 is circular, and it has a cylindrical portion 20 ("alarm plinth"), adjoining this a first flat portion 22, in turn adjoining this a conical portion 24, and finally a further flat portion 26. In the surface of the further flat portion 26, in particular in the center of this surface, there is located a signaling opening 28.

The conical portion 24 has around its circumference a plurality of air inlet openings 30. For the sake of clarity of the illustration, only individual air inlet openings 30 are designated by reference lines and reference numerals. Adjoining the air inlet openings 30 are housing ribs 32, which on the inner side of the cover 14 project from the surface of the further flat portion 26. Here too, for the sake of clarity of the illustration, designations have only been provided for some of these.

On its outer surface in the embodiment shown, the conical portion 24 is divided approximately into two in a fundamentally optional manner. A lower half has the air inlet openings 30. An upper half is outwardly closed. Approximately at the height of a notional dividing line between these two halves, in the interior of the alarm housing 12 and in the interior of the cover 14 there is located the printed circuit board 18 or generally a level divider 18. A level divider 18 comprises at least the printed circuit board and optionally for example at least one additional flat component that is arranged on the same level as the printed circuit board 18 and is combined in particular with the printed circuit board 18—for example a flat component in the form of a planar plastic part.

The printed circuit board 18 and the or each flat component together form, on one level, a closed surface. In the case of a printed circuit board 18 that acts alone as a level divider 18, the printed circuit board 18 has an outer peripheral line corresponding to the shape of the cover 14—thus for example a circular peripheral line. When the printed circuit board 18 is combined with at least one further flat component to form a level divider 18, the printed circuit board 18 may in principle have any desired external contour, for example being rectangular, triangular, semicircular, polygonal, etc.

Figure 2:
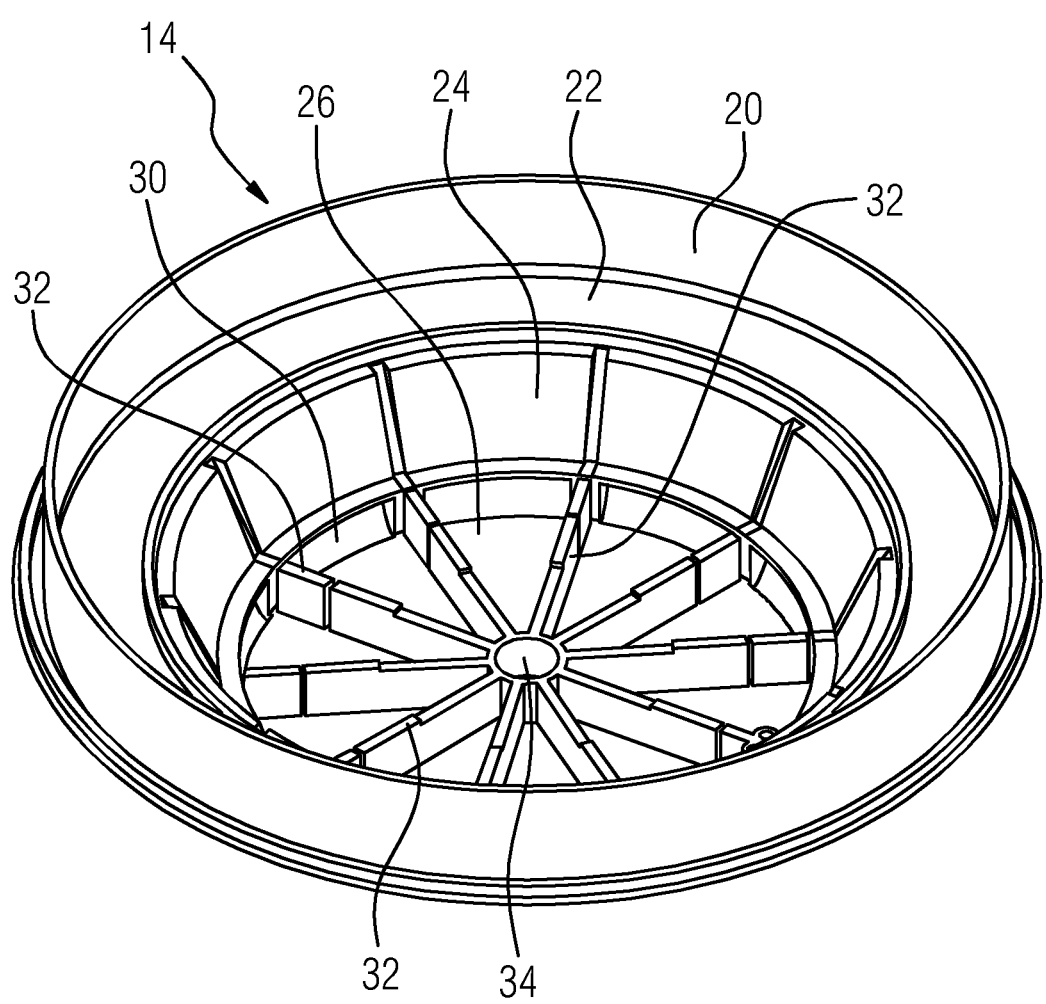
FIG. 2 shows a housing part, namely an alarm-housing cover, of the fire or smoke alarm incorporating teachings of the present disclosure.

The illustration in FIG. 2 shows the cover 14 without further components of the fire alarm 10, in an orientation in which there is a free view of the interior of the cover 14. Visible here are the cylindrical portion 20, the first flat portion 22, the conical portion 24 having the air inlet openings 30 at its lower end, and the further flat portion 26. It is particularly readily visible from the illustration in FIG. 2 that the cover 14 as mentioned above has on the inner side, in this case extending from the surface of the further flat portion 26 facing the housing interior, a plurality of housing ribs 32 that point radially in the direction of a central portion of the cover 14. The central portion is a hollow cylindrical termination of the housing ribs 32, and is designated an alarm dome 34 below, corresponding to the conventional specialist terminology. In the embodiment shown, the center point of the alarm dome 34 coincides with the main axis (not shown) of the fire alarm 10 (central alarm dome 34). Instead of a central alarm dome 34, an eccentric alarm dome 34 is also possible. In the text below, it should be understood that a variant with an eccentric alarm dome 34 is always included.

In the embodiment shown, each air inlet opening 30 is adjoined on both sides respectively by a housing rib 32 that extends peripherally from the air inlet opening 30. In some embodiments, two or more mutually adjacent air inlet openings 30 are respectively adjoined by a housing rib 32 that extends peripherally from a respective air inlet opening 30. In some embodiments, a housing rib 32 begins within the surface of an air inlet opening 30.

Figure 3:
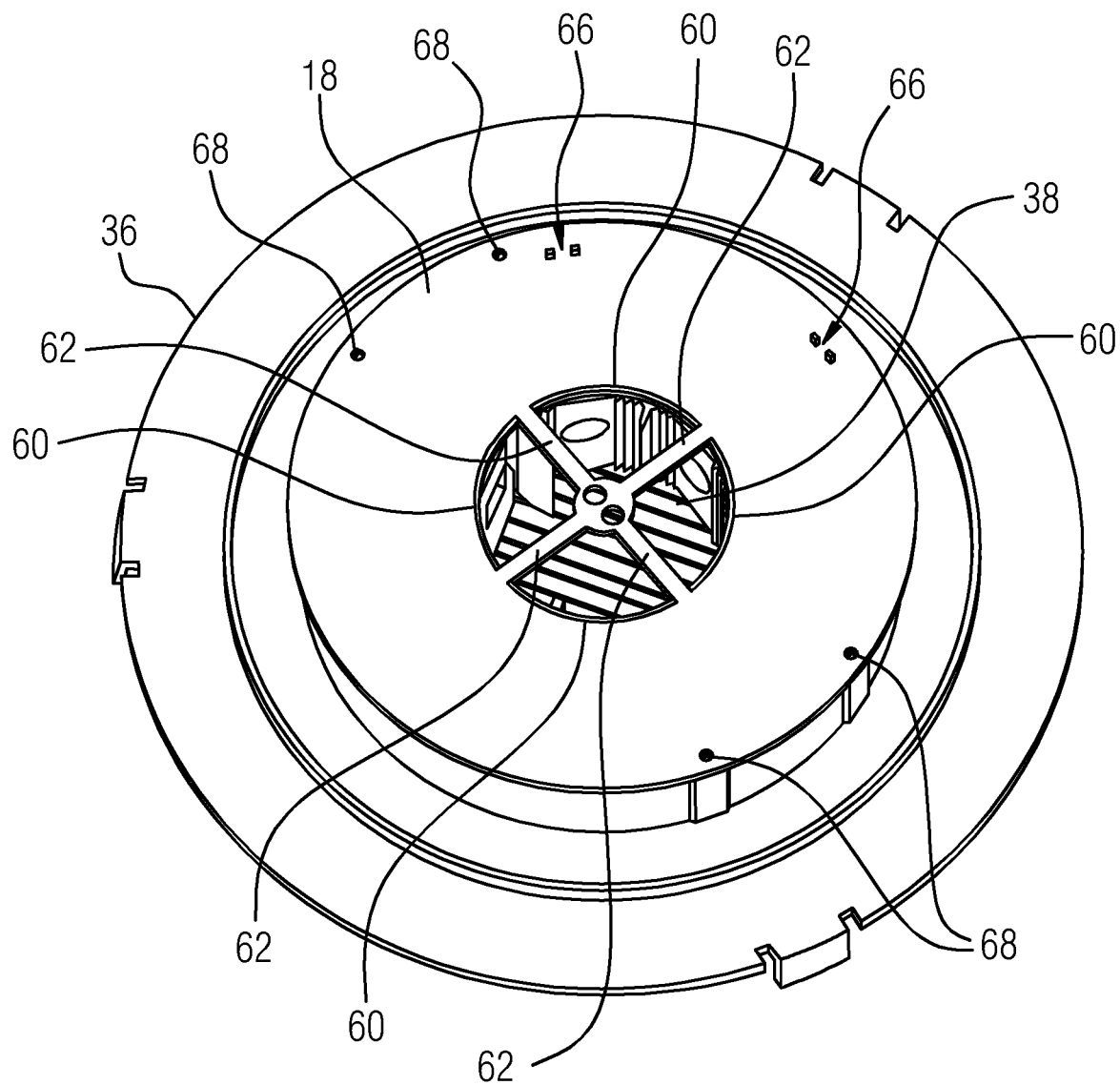
FIG. 3 shows a further housing part, namely a chamber part, of the fire or smoke alarm, and a printed circuit board connected thereto incorporating teachings of the present disclosure.
Figure 4:
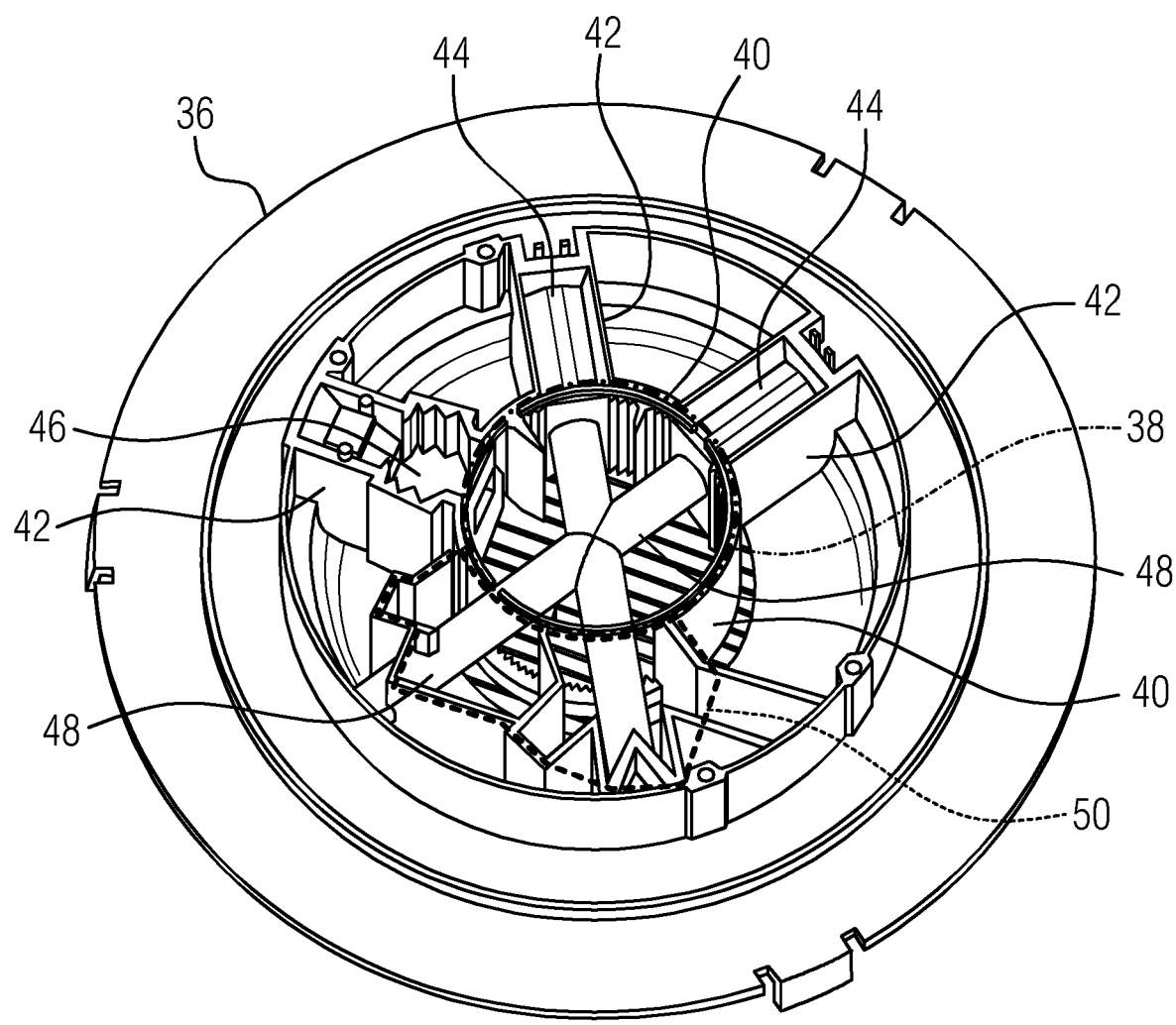
FIG. 4 shows the chamber part with a view of a measurement chamber that is formed within the chamber part incorporating teachings of the present disclosure.

The illustrations in FIG. 3 and FIG. 4 show a further housing part of the fire alarm 10. In the illustration in FIG. 3, the printed circuit board 18 is connected to it—in an orientation parallel to a main level of the housing part. This further housing part is designated the alarm housing chamber part below, or the chamber part 36 for short. Together with the printed circuit board 18, the chamber part 36 forms the measurement chamber 38 (and a light sink 50; FIG. 4) of the fire alarm 10. At some points, the printed circuit board 18 lies on the chamber part 36. At other points on the other hand, namely in the region of the measurement chamber 38, it does not.

The cover 14 can be combined with the chamber part 36, for example such that it can be detachably connected, in particular detachably latched, for example by means of a snap catch and a corresponding mating profile in or on the cover 14 and in or on the chamber part 36 respectively. In some embodiments, non-detachable connections such as a connection by ultrasonic welding are likewise possible.

The illustration in FIG. 4 shows the chamber part 36 without the printed circuit board 18. Here, it can be seen that the chamber part 36 has wall portions 40, in particular structured wall portions 40, which together form a measurement chamber 38 that is open to the cover 14 (further wall portions 40 form parts of the light sink 50; FIG. 4). Portions of receptacles 42 for at least one LED 44 or similar and for at least one photodiode 46 are also part of the wall portions 40 and are covered over by means of the printed circuit board 18 (as shown in the illustration in FIG. 3). The or each LED 44 and photodiode 46, and electronic equipment that is not shown, on the printed circuit board 18 together form a detection arrangement 16 that acts as a smoke detection arrangement.

In the illustration in FIG. 4, a ray path is shown in the interior of the measurement chamber 38. Rays 48 emanating from the LEDs 44 (which are offset from one another by 60° in the embodiment shown) end in a so-called light sink 50 (labyrinth) that absorbs light and is opposite the LEDs 44 on the measurement chamber 38. In the event of smoke particles or similar entering the measurement chamber 38, the rays from the LEDs 44 are scattered, and because of a scattering of this kind at least some of the light reaches the at least one photodiode 46, with the result that the generation of smoke is detected. In this case, for example a display element that is positioned on the printed circuit board 18, for example an LED (not shown), can be activated, the light signal or signals of which is/are guided to the outside of the fire alarm 10 by means of a light guide that passes through a hollow cylindrical alarm dome 34 and through the signaling opening 28.

Such smoke particles or similar enter the measurement chamber 38 that is formed in the chamber part 36 through a side of the measurement chamber 38 that is open to the cover 14. This open side lies on the level of the printed circuit board 18 (or on the level of a level divider 18 comprising at least the printed circuit board 18) and is produced as the result of at least one opening 60 in the printed circuit board 18 (or in a level divider 18 comprising the printed circuit board 18).

In the case of a printed circuit board 18 that acts alone as the level divider 18, it has the or each opening 60 as shown in the figures. In the case of a level divider 18 that comprises the printed circuit board 18, the opening 60 may also be at least partly located in a flat component that, in addition to the printed circuit board 18, forms part of the level divider 18, and in the case of a plurality of openings 60, all or some of the individual openings 60 may be located on the one hand in the printed circuit board 18 and on the other in the flat component or a flat component.

This should always be understood as included and taken into account in the description below, which—for the sake of making it easier to read—will refer below to a printed circuit board 18 acting alone as the level divider 18.

In the illustration in FIG. 3, an embodiment having a printed circuit board 18 with four openings 60 of the same size is shown by way of example. The openings 60 are in the shape of a circle sector, and between each two adjacent openings 60 there is left a web 62, wherein all the webs 62 meet in the center, namely at a center piece 64. All the openings 60 together can also be regarded as one opening 60 that is divided into different regions by a web 62 or a plurality of webs 62.

In the embodiment shown, the printed circuit board 18 is circular and arranged centrally in relation to the likewise circular chamber part 36. The four openings 60 (considered together) form a circular cutout in the center of the printed circuit board 18, and, corresponding to the arrangement of the printed circuit board 18 in relation to the chamber part 36 and the position of the cutout in the total surface of the printed circuit board 18, this cutout is located centrally above the chamber part 36 (and thus centrally below the center of the cover 14).

Said circular cutout may take the form of a single circular opening 60 or—as shown—the form of a circular opening 60 that is divided into different regions by webs 62. If these regions are each regarded as separate openings 60, their outer peripheral lines each have the same radius and all lie on a single circular line. This circular line is designated the common peripheral line of a plurality of openings 60. Ambient air, where appropriate charged with smoke particles or similar, passes from the level with the ribs 32 through the or each opening 60 in the printed circuit board 18 and reaches the level with the measurement chamber 38. The diameter of a single circular opening 60 is therefore larger than the diameter of the alarm dome 34 of the cover 14. Likewise, the diameter of a circular opening 60 that is divided into different regions by webs 62 is larger than the diameter of the alarm dome 34 of the cover 14. Where such regions are each considered as individual openings 60, this applies correspondingly. In that case, the maximum possible spacing between two points on a common peripheral line of these openings 60 is larger than the diameter of the alarm dome 34. Because of this ratio (diameter of opening 60 to diameter of alarm dome 34, or maximum possible spacing on the peripheral line to diameter of alarm dome 34), space for an air flow to pass from the level with the ribs 32 into the measurement chamber 38 is left laterally adjacent to the alarm dome 34. If the air flow carries along smoke particles or similar, this is detected there (as outlined above).

In the illustration in FIG. 3, individual contact points 66, 68 are shown on the surface of the printed circuit board 18 that is to say contact points 66 for example for solder contacts for making the contacts for the LEDs 44, and contact points 68 for example for solder contacts for plinth contacts.

Figure 5:
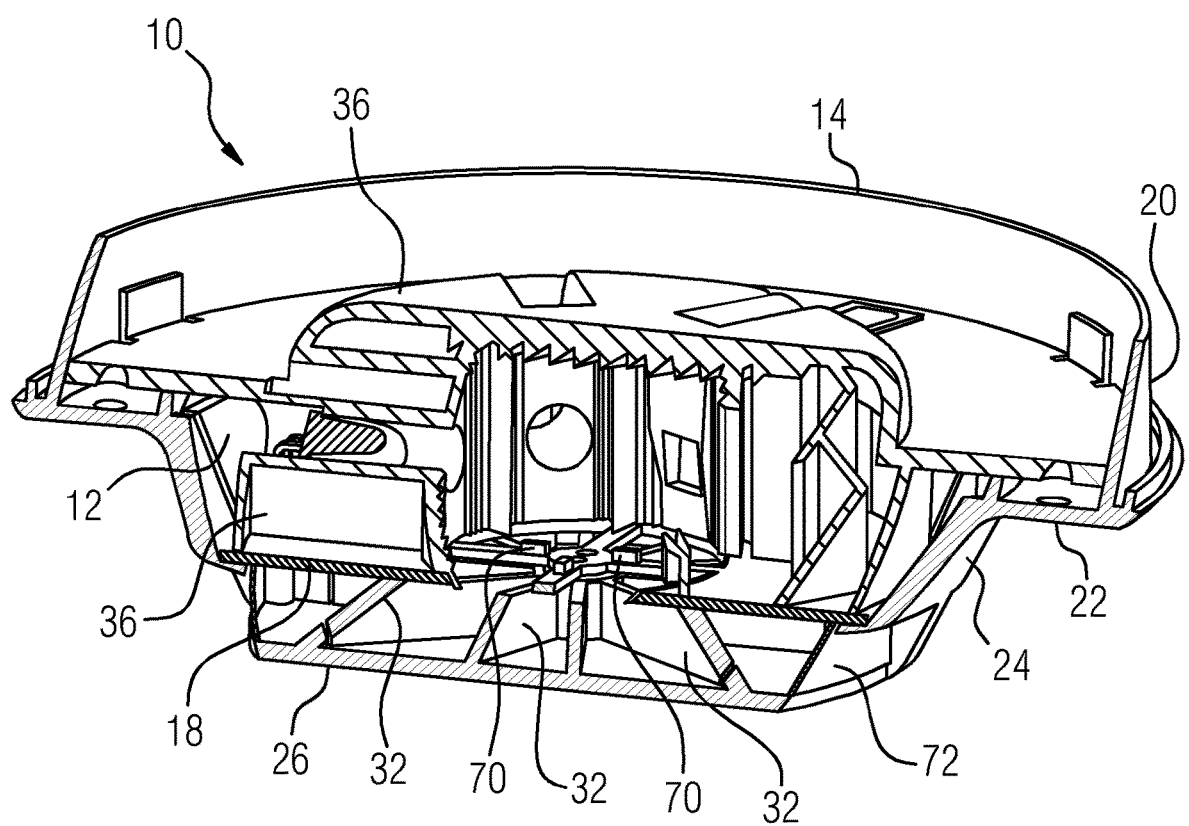
FIG. 5 shows the fire or smoke alarm in a cut-away side view incorporating teachings of the present disclosure.

The illustration in FIG. 5 shows a cut-away illustration of the fire alarm 10, the line of section being parallel to its vertical axis. The chamber part 36 is connected to the cover 14. The connection is made by means of individual latching tabs that extend peripherally from the chamber part 36 and have at their free ends latching lugs that engage in corresponding cutouts at the inner side of the cylindrical portion 20 of the cover 14.

In the illustration in FIG. 5, as a result of the section the above-mentioned different levels namely a level with the housing ribs 32 and a level with the measurement chamber 38 (FIG. 4, FIG. 6) are readily visible. The printed circuit board 18 forms the boundary between these two levels. Located on the webs 62 are electronic components with a sensing action (sensor equipment), namely temperature sensors 70, in particular semiconductor temperature sensors (NTCs). In principle, a configuration in which—as shown—exactly one or at least one temperature sensor 70 is located on each web 62 is conceivable. In some embodiments, a configuration in which exactly one or at least one temperature sensor 70 is located only on individual webs 62 is also possible. Where there is a plurality of temperature sensors 70, they may be positioned symmetrically in relation to the alarm dome 34. The temperature sensors 70 may be positioned—as shown—on the component side of the printed circuit board 18 (on the surface pointing in the direction of the chamber part 36) or on the other surface of the printed circuit board 18.

The air inlet openings 30 in the conical portion 24 of the cover 12 are closed off by means of an insect protection element 72. As the insect protection element 72 there acts a cloth or a grille-like or mesh-like structure with openings that enable ambient air and any smoke particles or similar that it carries along to pass through unhindered, but keep for example insects out of the interior of the fire alarm 10.

Figure 6:
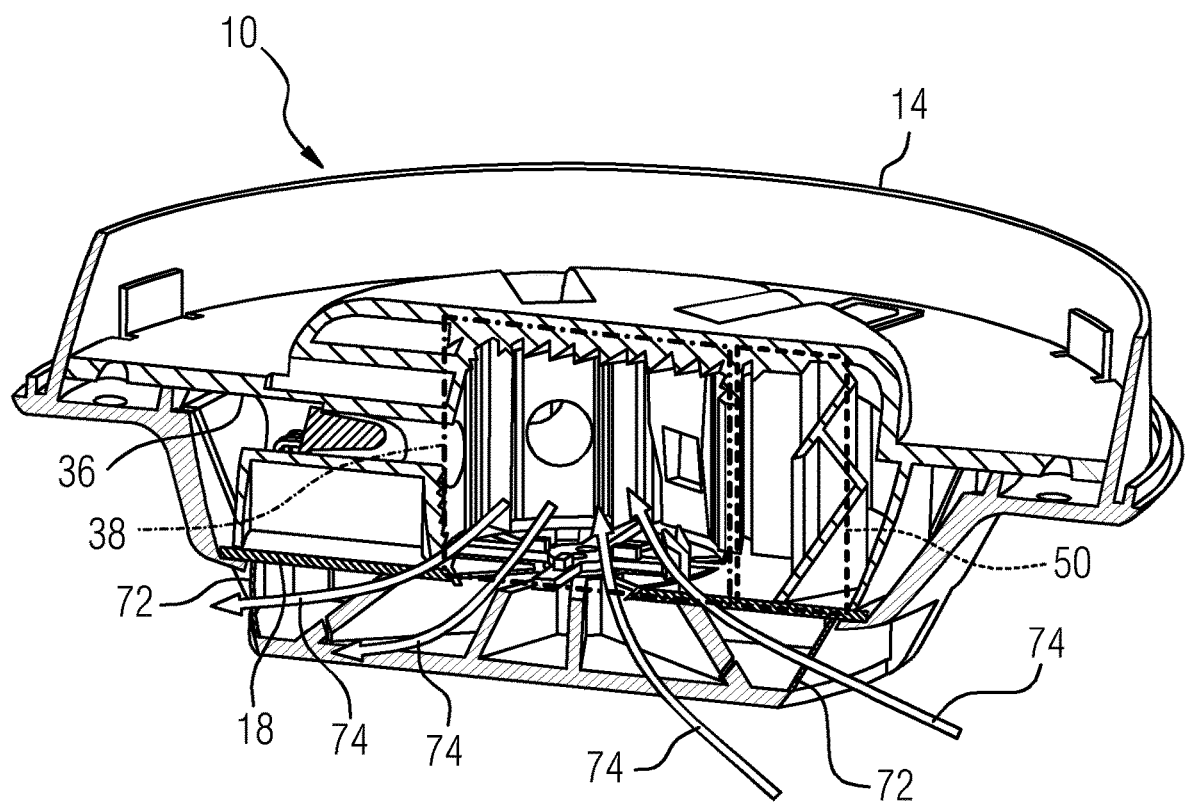
FIG. 6 shows the fire or smoke alarm according to FIG. 5, with an illustration of a possible air flow into and out of the measurement chamber that is established during operation incorporating teachings of the present disclosure.

The illustration in FIG. 6 shows (from the same perspective as FIG. 5, and with the same plane of section) a possible air flow 74 that is established when the fire alarm 10 is used, into and out of the measurement chamber 38.

Figure 7:
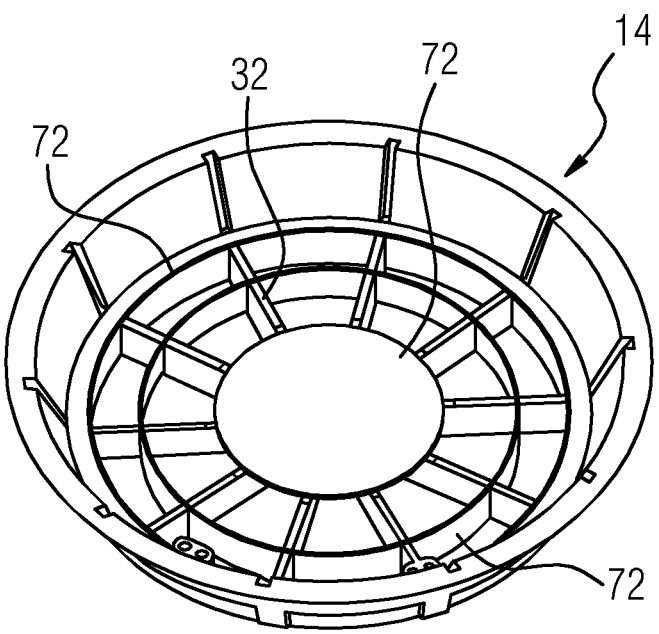
FIG. 7 shows a possible arrangement of an insect protection element in the alarm-housing cover incorporating teachings of the present disclosure.

The illustration in FIG. 7 shows a possible arrangement of the insect protection element 72 in the interior of the cover 14. The insect protection element 72 may be positioned—as shown in FIG. 7 and also in FIG. 6—along an enclosed circular line, directly adjacent to the air inlet openings 30. Equally, the insect protection element 72 may be positioned further in the direction of the alarm dome 34 (not visible in the illustration in FIG. 7) and likewise along an enclosed circular line. The insect protection element 72 thus blocks any air route between each two adjacent housing ribs 32, preventing insects or similar from entering the interior of the fire alarm 10 and the measurement chamber 38 there. In some embodiments—as shown in FIG. 7—there is a flat insect protection element 72, which covers the opening 60 or all the openings 60 in the printed circuit board 18. For the purpose of receiving a flat insect protection element 72 between the upper edges of the housing ribs 32 and the printed circuit board 18, the housing ribs 32 may have at their upper edges a stepped profile, in each case with at least one step, as is particularly readily visible in the illustration in FIG. 2.

Figure 8:
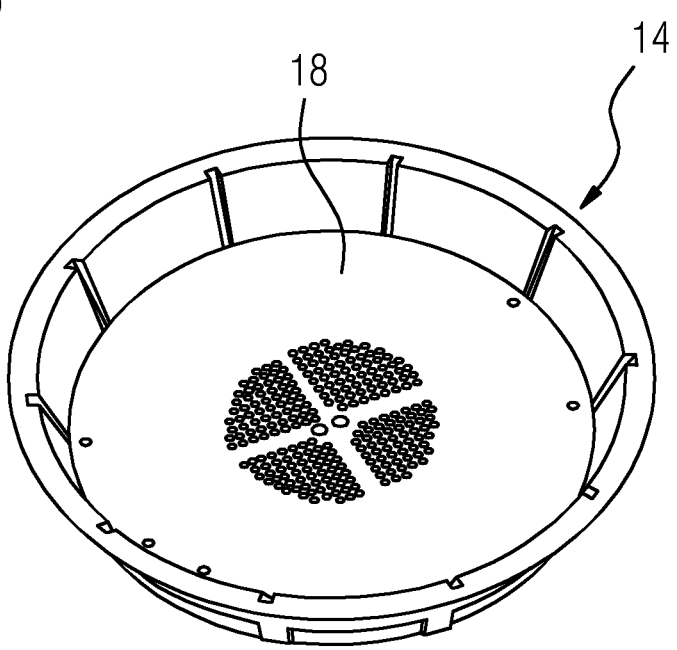
FIG. 8 shows a printed circuit board that is arranged in the alarm-housing cover and acts as a flat insect protection element incorporating teachings of the present disclosure.

It is also possible for the printed circuit board 18 itself to act as the insect protection element 72—as shown in FIG. 8. In that case, it has in the region of the or each opening 60 relatively small "holes" (openings, boreholes, cutouts), which as a whole enable an air flow to pass through, in the manner of a mesh. Insects or similar are retained.

In some embodiments, there is a conical or basket-shaped insect protection element 72. Such an insect protection element 72 comprises a flat center portion, which is in contact with the inner side of the cover 14, and a peripheral portion, which projects peripherally from the center portion as far as the printed circuit board 18, at an angle of for example 45°. This produces an insect protection element 72 that is conical in its envelope contour or, with a slight deformation, a basket-shaped insect protection element 72.

In some embodiments, exactly one insect protection element 72 of the type shown is sufficient. A plurality of insect protection elements 72 is possible. Instead of a separate insect protection element 72, another possibility is for the opening 60 in the printed circuit board 18 to take the shape of a grille structure, as shown in the illustration in FIG. 8.

Figure 9:
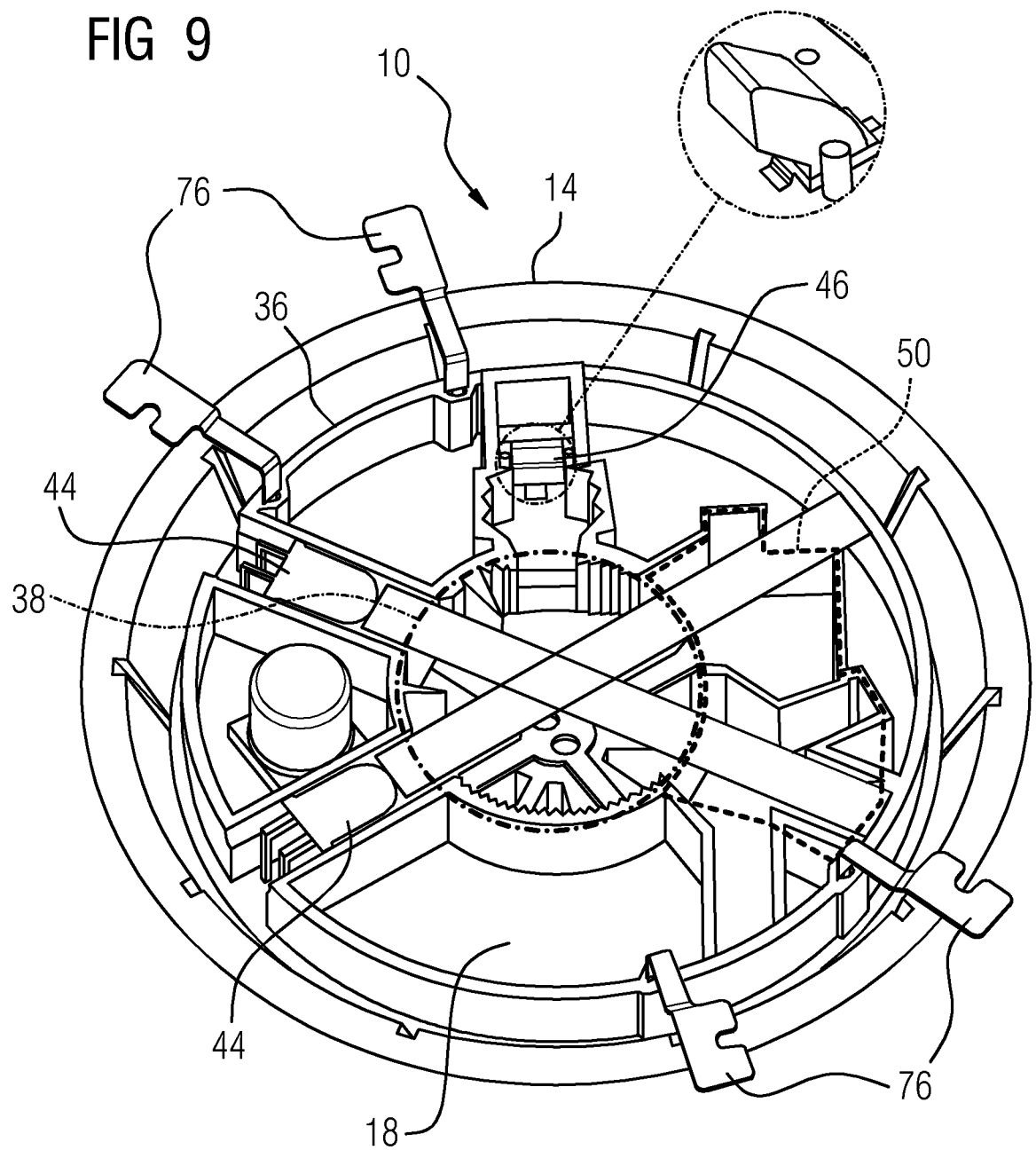
FIG. 9 shows a section through the fire or smoke alarm on a level parallel to the printed circuit board incorporating teachings of the present disclosure.

The illustration in FIG. 9 shows a horizontal section through the fire alarm 10. The printed circuit board 18 may be black in the region of the measurement chamber 38 and in the region of the light sink 50. In some embodiments, a lens is associated with the photodiode 46 and deflects incident light that is scattered in the measurement chamber 38 by 90°, to the level of the printed circuit board 18, with the result that the photodiode 46 can be arranged with its surface having the sensing action parallel to the surface of the printed circuit board 18 (SMD component). Extending from a peripheral wall of the chamber part 36 there are shown plinth contact lugs 76, which are joined (in particular in one piece) to pin-shaped conductor elements that are embedded in the wall of the chamber part 36 and are electrically conductively connected to the circuit on the printed circuit board 18 by means of the contact points 68 (FIG. 3). By means of at least two plinth contact lugs 76, electrical energy is supplied to the printed circuit board 18 and the printed circuit board 18 is connected to an outgoing network, namely a network for transmitting at least one signal from the fire alarm 10 for example to a higher-level fire alarm control center.

Figure 10:
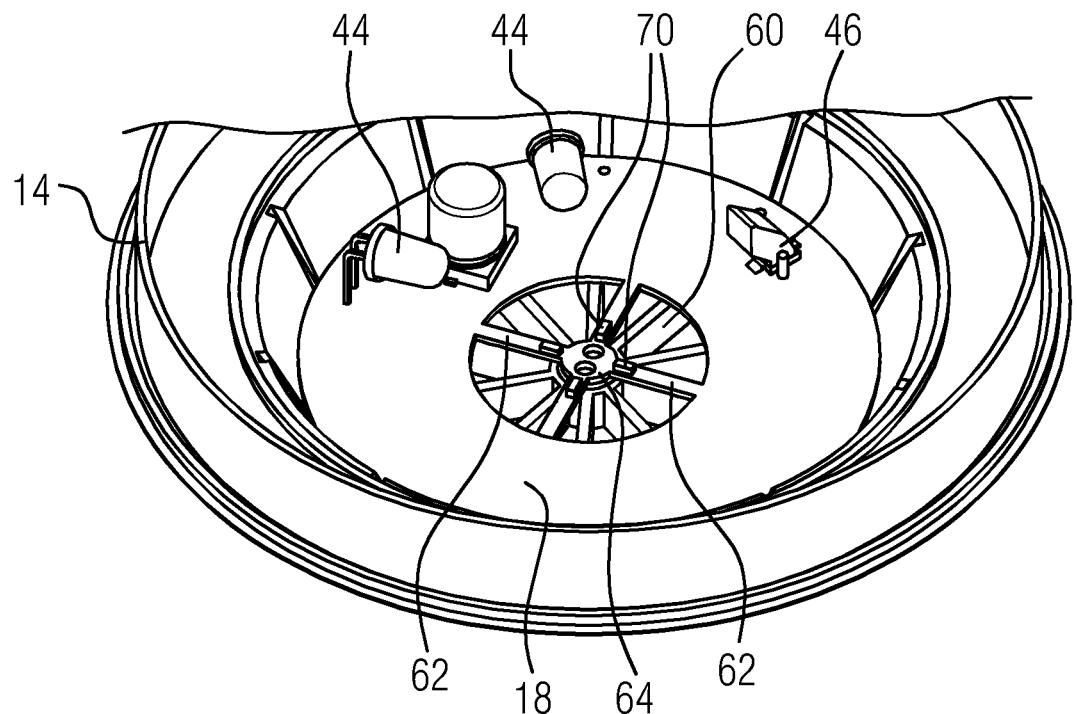
FIG. 10 shows possible locations at which temperature sensors may be mounted incorporating teachings of the present disclosure.

The illustration in FIG. 10 shows possible positions of sensor equipment for detecting temperature measurement values, namely the position of the temperature sensors 70 which has already been explained in conjunction with the description of FIG. 5, on the webs 62 of the printed circuit board 18—that is to say a position of the temperature sensors 70 in the center of the printed circuit board 18 and in the region of the measurement chamber 38. In some embodiments, at least one temperature sensor 70 may also be positioned on the center piece 64 carried by the webs 62. The center piece 64 is likewise a possible location for mounting a display element (LED or similar) acting as an alarm indicator. In that case, the display element is located in the region of the main axis of the fire alarm 10.

Figure 11:
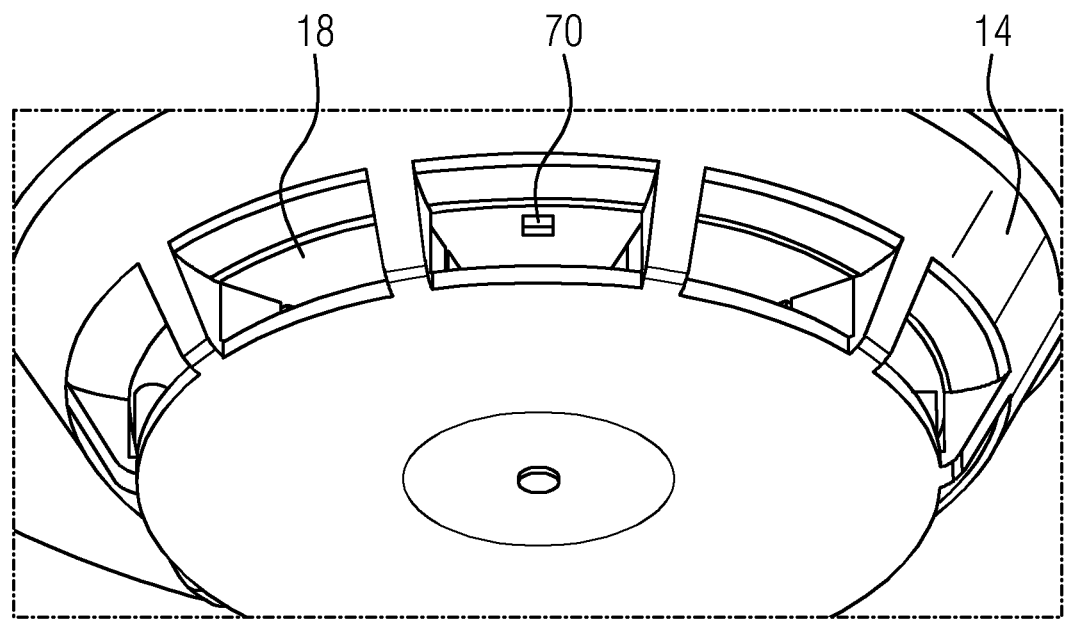
FIG. 11 shows a particular way of mounting a temperature sensor incorporating teachings of the present disclosure.

In contrast to mounting at least one temperature sensor 70 on at least one web 62 or the center piece 64, the illustration in FIG. 11 shows the temperature sensors 70 positioned peripherally (peripherally with respect to the printed circuit board 18). In this case too, a symmetrical distribution of the temperature sensors 70 may be provided, for example an arrangement of three, four, five, etc. temperature sensors 70 distributed regularly along the circumferential line of the printed circuit board 18.

Although the teachings of the present disclosure have been described and illustrated in detail by way of the exemplary embodiment, the scope of the disclosure is not restricted by the disclosed example, and those skilled in the art may derive other variations therefrom without departing from the scope thereof.

Individual prominent aspects of the description filed here can thus be summarized in brief as follows: there is specified a fire or smoke alarm 10 having a detection arrangement 16, which is arranged in the interior of an alarm housing 12, wherein the alarm housing 12 comprises at least one alarm-housing cover 14. The detection arrangement 16 comprises at least one printed circuit board 18, and the printed circuit board 18 has at least one opening 60. The or each opening 60 acts as an "air inlet" into a measurement chamber 38 in the interior of the alarm housing 12. For the purpose of guiding an air flow into the measurement chamber 38, on an inner side the alarm-housing cover 14 has a plurality of housing ribs 32 that point radially in the direction of a so-called alarm dome 34. The housing ribs 32 are connected in one piece with the alarm-housing cover 14, and a base of the alarm-housing cover 14 forms (in the interior of the alarm-housing cover 14) the lower boundary of the housing ribs 32. The housing ribs 32 are upwardly delimited by the printed circuit board 18. The housing ribs 32 meet in the region of the alarm dome 34, or meet the alarm dome 34. In all cases, the alarm dome 34 creates an obstacle to air flow.

In order to enable the air flow to enter the measurement chamber 38 despite this obstacle, the surface of the opening 60 or the surface of all the openings 60 is larger than the surface that is, the projected surface that is projected from the main axis of the fire or smoke alarm 10—of the alarm dome 34. Although no reference is made to such a surface, this is defined in the description in that a maximum possible spacing between two points on a peripheral line of the opening 60 or on a common peripheral line of a plurality of openings 60 is larger than a diameter of the alarm dome 34. The peripheral line of the opening 60 in the printed circuit board 18 or the common peripheral line of a plurality of openings 60 in the printed circuit board 18 extends beyond the alarm dome 34 of the alarm-housing cover 14 on all sides. This is achieved in the embodiment shown, in a manner that is fundamentally optional, in that the printed circuit board 18 is arranged with the peripheral line of its opening 60 or the common peripheral line of a plurality of openings 60 concentric with the alarm dome 34 of the alarm-housing cover 14. In both cases, space for the air flow to pass from the level with the housing ribs 32 through the or each opening 60 and into the measurement chamber 38 is left all around the alarm dome 34.

LIST OF REFERENCE NUMERALS

10 Fire or smoke alarm, fire alarm
12 Alarm housing
14 Alarm-housing cover, cover (part of the alarm housing)
16 Detection arrangement
18 Level divider/printed circuit board
20 Cylindrical portion (of the cover)
22 Flat portion (of the cover)
24 Conical portion (of the cover)
26 Further flat portion (of the cover)
28 Signaling opening
30 Air inlet opening
32 Housing rib
34 Alarm dome
36 Chamber part (part of the alarm housing)
38 Measurement chamber
40 Wall portion (of the chamber part)
42 Receptacle (for LED or photodiode)
44 LED
46 Photodiode
48 Rays (ray path of the LED)
50 Light sink
52-58 (not allocated)
60 Opening (in the printed circuit board)
62 Web (in the opening)
64 Center piece
66, 68 Contact point
70 Sensor equipment, sensor, temperature sensor
72 Insect grille
74 Air flow
76 Plinth contact lug
78 Wall portion (of the chamber part)

What is claimed is:

1. An alarm comprising:
a detection arrangement for smoke and/or fire arranged within an alarm housing; and
an alarm-housing cover having,
on an inner side, a plurality of housing ribs pointing radially in the direction of an alarm dome;
wherein the detection arrangement comprises a level divider with an opening;
a maximum possible spacing between two points on a peripheral line of the opening or on a common peripheral line of a plurality of openings is larger than a diameter of the alarm dome; and
the peripheral line of the opening or the common peripheral line of a plurality of openings in the level divider extends beyond the alarm dome of the alarm housing cover on all sides.

2. The alarm as claimed in claim 1, wherein the level divider comprises a printed circuit board.

3. The alarm as claimed in claim 1,
wherein:
a printed circuit board and a flat component are arranged parallel to one another and on the same level; or
a printed circuit board and a flat component are arranged parallel to one another on parallel levels; and
the printed circuit board and the flat component, together, act as the level divider.

4. The alarm as claimed in claim 1, wherein the level divider is arranged in the alarm housing with the peripheral line of its opening or the common peripheral line of a plurality of openings concentric with the alarm dome.

5. The alarm as claimed in claim 1, wherein the level divider defines a circular outer circumferential line.

6. The alarm as claimed in claim 5, wherein the peripheral line of the opening or the common peripheral line of a plurality of openings is concentric with the circular outer circumferential line.

7. The alarm as claimed in claim 1,
wherein:
the alarm housing comprises a chamber part with wall portions forming a measurement chamber having a side open to the alarm housing cover, and
the side of the measurement chamber is on a level with the level divider.

8. The alarm as claimed in claim 7, wherein the chamber part closes the measurement chamber off on a second side remote from the opening.

9. The alarm as claimed in claim 7, wherein an interior of the measurement chamber is fluidically coupled to an area surrounding the alarm by means of the opening in the level divider.

10. The alarm as claimed in claim 1, further comprising:
a plurality of openings with a shape of a circle segment or circle sector and a common peripheral line;
a web between each set of two adjacent openings; and
a sensor on at least one web.

11. The alarm as claimed in claim 1, further comprising a plurality of openings with a shape of a circle segment or circle sector and having a common peripheral line; and
a web between each set of two adjacent openings;
wherein the webs carry a center piece; and
the center piece carries a sensor element and/or a display element.

12. The alarm as claimed in claim 10, wherein the sensor comprises a temperature-sensitive sensor.

13. The alarm as claimed in claim 1, further comprising an insect protection element covering each opening.

14. The alarm as claimed in claim 1, further comprising an insect protection element arranged along an enclosed circular line having a diameter larger than the maximum possible spacing between two points on a peripheral line of the opening or on a common peripheral line of a plurality of openings;
wherein the insect protection element is adjacent to the inner side of the alarm-housing cover; and
from an inner side of the alarm housing cover, the insect protection element has a height corresponding to a height of the housing ribs on the inner side of the alarm-housing cover.

15. The alarm as claimed in claim 1, further comprising an insect protection element a level of free upper edges of the housing ribs.

* * * * *